United States Patent
Park et al.

(10) Patent No.: US 8,795,505 B2
(45) Date of Patent: Aug. 5, 2014

(54) COPPER ELECTROPLATING METHOD (75) Inventors: Myung-Beom Park, Hwaseong-si (KR); Jung-Sik Choi, Seongnam-si (KR); Ki-Hyeon Kim, Seoul (KR); Yuji Morishima, Tokyo (JP); Shin-ichi Tanaka, Tokyo (JP); Takashi Yamada, Tokyo (JP); Takehiro Zushi, Tokyo (JP)

(73) Assignees: Samsung Electronics Co., Ltd., Suwon-si, Gyeonggi-do (KR); Adeka Corporation, Tokyo (JP)

( * ) Notice: Subject to any disclaimer, the term of this patent is extended or adjusted under 35 U.S.C. 154(b) by 218 days.

(21) Appl. No.: 13/290,520

(22) Filed: Nov. 7, 2011

(65) Prior Publication Data
US 2012/0211369 A1 Aug. 23, 2012

(30) Foreign Application Priority Data

Feb. 18, 2011 (KR) .................. 10-2011-0014764

(51) Int. Cl.
*C25D 3/38* (2006.01)
*C25D 17/00* (2006.01)
*C25D 7/12* (2006.01)
*H01L 21/71* (2006.01)
*H01L 21/02* (2006.01)
*H01L 21/768* (2006.01)

(52) U.S. Cl.
CPC ................ *C25D 3/38* (2013.01); *C25D 17/001* (2013.01); *C25D 7/12* (2013.01); *H01L 21/02* (2013.01); *H01L 21/76898* (2013.01)
USPC ........... 205/296; 205/118; 205/122; 205/123; 205/134; 205/157; 205/261; 205/291

(58) Field of Classification Search
CPC ...................................... C25D 3/38
USPC ................................................ 205/118
See application file for complete search history.

(56) References Cited

U.S. PATENT DOCUMENTS 6,605,204 B1   8/2003  Martyak et al.
6,755,957 B2   6/2004  Nakamura et al.
(Continued)

FOREIGN PATENT DOCUMENTS

EP             1118696 A1 *  7/2001  ............... C25D 3/38
KR    10-2001-0040084 A     5/2001
(Continued)

OTHER PUBLICATIONS

Kim et al, New Leveler for Leveling and Cu Electro Deposition by Using the Same (Machine Translation), KR 10-2007-0067813, Feb. 26, 2009.*

*Primary Examiner* — James Lin
*Assistant Examiner* — Ho-Sung Chung
(74) *Attorney, Agent, or Firm* — Lee & Morse, P.C.

(57) ABSTRACT

A copper electroplating method including dipping a substrate in a copper electroplating solution, the substrate including a seed layer; and forming a copper electroplating layer on the seed layer, wherein the copper electroplating solution includes water, a copper supply source, an electrolytic material, and a first additive, the first additive includes a compound represented by Formula 1, below:

[Formula 1]

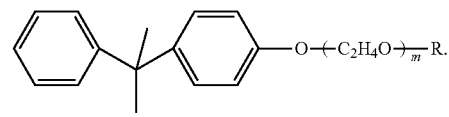

14 Claims, 7 Drawing Sheets (56) References Cited

U.S. PATENT DOCUMENTS

| | | |
|---|---|---|
| 7,220,347 B2 * | 5/2007 | Isono et al. .................. 205/118 |
| 7,575,666 B2 | 8/2009 | Watkowski et al. |
| 2004/0045832 A1 | 3/2004 | Martyak |
| 2004/0187731 A1 * | 9/2004 | Wang et al. ................. 106/1.13 |
| 2009/0321269 A1 * | 12/2009 | Tsuji et al. ................... 205/242 |
| 2010/0084277 A1 * | 4/2010 | Park et al. ...................... 205/95 |
| 2010/0237499 A1 * | 9/2010 | Kim ............................... 257/741 |

FOREIGN PATENT DOCUMENTS

| | | | |
|---|---|---|---|
| KR | 10-2001-0078217 A | 8/2001 | |
| KR | 10-2007-0067813 | * 6/2007 | ............... C25D 3/38 |

* cited by examiner

COPPER ELECTROPLATING METHOD

CROSS-REFERENCE TO RELATED APPLICATION

This application claims priority under 35 U.S.C. §119 to Korean Patent Application No. 10-2011-0014764 filed on Feb. 18, 2011, the disclosure of which is hereby incorporated by reference in its entirety.

BACKGROUND

1. Field

Embodiments relate to copper electroplating solutions, copper electroplating methods and a copper electroplating apparatus using the same and fabricating methods of the same.

2. Description of the Related Art

In order to electrically connect semiconductor chips or semiconductor packages by stacking the semiconductor chips or packages (e.g., a package-on-package (PoP) technique), a method of electrically connecting the semiconductor chips by forming through-silicon via (TSV) plugs using a copper electroplating process may be used.

SUMMARY

Embodiments are directed to a copper electroplating method.

The embodiments may be realized by providing a copper electroplating method including dipping a substrate in a copper electroplating solution, the substrate including a seed layer; and forming a copper electroplating layer on the seed layer, wherein the copper electroplating solution includes water, a copper supply source, an electrolytic material, and a first additive, the first additive includes a compound represented by Formula 1, below, and in Formula 1, R is hydrogen or alkyl, and m is an integer of about 6 to about 14.

[Formula 1]

The copper electroplating solution may include the first additive at a concentration of about 0.5 to about 200 mg/L.

The copper electroplating solution may further include a second additive, the second additive including a compound represented by Formula 2, below, in which D is hydrogen, an alkyl, or a metal.

[Formula 2]

The copper electroplating solution may include the second additive at a concentration of about 10 to about 400 mg/L.

The copper electroplating solution further includes a third additive, the third additive including a compound including a moiety represented by Formula 3, below, in which n is a natural number of about 5 to about 100.

[Formula 3]

The copper electroplating solution may include the third additive at a concentration of about 0.5 to about 200 mg/L.

The copper supply source may include copper (II) methanesulfonic acid, the copper (II) methanesulfonic acid being included in the copper electroplating solution at a concentration of about 200 to about 500 g/L.

The electrolytic material may include methanesulfonic acid, the methanesulfonic acid being included in the copper electroplating solution at a concentration of about 5 to about 20 g/L.

The copper electroplating solution may further include a chlorine ion source.

The chlorine ion source may include hydrogen chloride, the hydrogen chloride being included in the copper electroplating solution at a concentration of about 2.5 to about 250 ml/L.

The copper electroplating solution may further include polyethylene glycol.

The copper electroplating solution may be provided in an electroplating container of a copper electroplating apparatus, the copper electroplating apparatus may include an anode and a cathode, and forming the copper electroplating layer may include applying current between the anode and the cathode at a density of about 1.0 to about 100 mA/cm².

Applying the current may include initially applying current at a relatively low density and subsequently applying current at a relatively high density.

The method may be performed with a copper electroplating apparatus, the copper electroplating apparatus including a rotary motor that rotates the substrate in the copper electroplating solution in a horizontal direction; and a solution circulator that circulates the copper electroplating solution through an electroplating container and a subsidiary storage container, wherein the rotary motor rotates the substrate in the copper electroplating solution at a rate of about 1 to about 60 RPM, and the copper electroplating solution is circulated through the solution circulator at a rate of about 1 to about 30 LPM.

The embodiments may also be realized by providing a copper electroplating method including dipping a substrate in a copper electroplating solution to form a copper electroplating layer on the substrate, wherein the copper electroplating solution includes water, a copper supply source, an electrolytic material, and a leveler, the leveler includes a compound including a moiety represented by Formula 3, below, in which n is a natural number of about 5 to about 100.

[Formula 3]

The embodiments may also be realized by providing a copper electroplating method for forming a through-silicon via plug in a substrate, the method including placing the substrate in a copper electroplating solution; and electrolytically forming a copper electroplating layer on the substrate such that the copper electroplating layer fills a via in the substrate, wherein the copper electroplating solution includes a copper supply source, an electrolytic material, a suppressor, an accelerator, and a leveler.

The suppressor may include at least one of a compound represented by Formula 1, below:

[Formula 1]

in which R is hydrogen or alkyl, and m is an integer of about 6 to about 14; a copolymer of polypropylene glycol and polyethylene oxide; and a compound represented by Formula 4, below.

[Formula 4]

in which p is about 9 and R is a group represented by at least one of Formula 5 or Formula 6, below,

[Formula 5]

[Formula 6]

The accelerator may include a compound represented by Formula 2, below, in which D is hydrogen, an alkyl, or a metal.

[Formula 2]

The D may be any one selected from the group consisting of hydrogen (H), lithium (Li), sodium (Na), and potassium (K)

The leveler may include at least one of a compound including a moiety represented by Formula 3, below, in which, n is a natural number of about 5 to about 100,

[Formula 3]

a compound including a moiety represented by Formula 7, below, in which a is a number such that the compound including the moiety represented by Formula 7 has a number-average molecular weight of about 30,000, and M is an alkali metal

[Formula 7]

a compound including a moiety represented by Formula 8, below, in which b is a number such that the compound including the moiety represented by Formula 8 has a number-average molecular weight of about 70,000, and $X^-$ is a counter ion,

[Formula 8]

a compound including a moiety represented by Formula 9, below, in which c is a number such that the compound including the moiety represented by Formula 9 has a number-average molecular weight of about 60,000,

[Formula 9]

and a copolymer of vinylpyrrolidone and methylvinyl imidazolium chloride.

The suppressor may be included in the copper electroplating solution in a concentration of about 0.5 to about 200 mg/L, the accelerator may be included in the copper electroplating solution in a concentration of about 10 to about 400 mg/L, and the leveler may be included in the copper electroplating solution in a concentration of about 0.5 to about 200 mg/L.

The copper supply source includes copper (II) methanesulfonic acid (MSA) ($Cu(CH_3SO_2OH)_2$) or copper sulfate ($CuSO_4$ or $Cu_2SO_4$).

The electrolytic material includes MSA (($CH_3SO_2OH)_2$) or sulfuric acid ($H_2SO_4$).

The chlorine ion source contains hydrogen chloride (HCl) or sodium chloride (NaCl).

BRIEF DESCRIPTION OF THE DRAWINGS

The embodiments will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could be termed a "second" element, component, region, layer or section without departing from the teachings of the inventive concept.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Throughout the specification, unless otherwise noted, concentration given in units of, e.g., g/L, mg/L, or ml/L, is based on a total volume of the solution being referred to.

A copper electroplating solution according to an embodiment may include a copper (Cu) supply source, an electrolytic material, and an additive. The additive may include, e.g., a suppressor, an accelerator, a leveler, a surfactant, an antifoamer, and/or a ductilizer. In an implementation, the copper electroplating solution may include chlorine ions or a chlorine ion source. The copper electroplating solution may include water.

The copper supply source may include, e.g., copper (II) methanesulfonic acid (MSA) ($Cu(CH_3SO_2OH)_2$) and/or copper sulfate ($CuSO_4$ or $Cu_2SO_4$).

The electrolytic material may be dissolved in the copper electroplating solution to increase conductivity of the copper electroplating solution. The electrolytic material may include, e.g., MSA ($CH_3SO_2OH$) and/or sulfuric acid ($H_2SO_4$).

In an implementation, the copper electroplating solution may include, e.g., the suppressor, the accelerator, and the leveler, as additives.

The chlorine ions or chlorine ion source may assist the suppressor. The chlorine ion source may be dissolved in the copper electroplating solution and may emit chlorine ions $Cl^-$.

The chlorine ions may help suppress a copper electroplating speed during the copper electroplating process. For example, the chlorine ions or the chlorine ion source may serve as a subsidiary suppressor. In an implementation, the subsidiary suppressor may include, e.g., polyethylene glycol (PEG) ($HO(CH_2CH_2O)_nH$, where n is a positive integer) instead of the chlorine ions or the chlorine ion source. In another implementation, the subsidiary suppressor may include both PEG and the chlorine ions or chlorine ion source.

Hereinafter, various copper electroplating solutions according to the embodiments will be described in further detail.

A copper electroplating solution according to an embodiment may include copper (II) MSA ($Cu(CH_3SO_2OH)_2$) as a copper supply source, MSA ($CH_3SO_2OH$) as an electrolytic material, a chlorine ion source, a first additive, a second additive, a third additive, and water.

The copper electroplating solution according to the present embodiment may include the copper (II) MSA at a concentration of about 200 to about 500 g/L, e.g., at a concentration of about 250 to about 450 g/L.

The copper electroplating solution according to the present embodiment may include the MSA at a concentration of about 5 to about 20 g/L, e.g., about 10 to about 20 g/L.

The copper electroplating solution according to the present embodiment may include the chlorine (Cl) ion source at a concentration of about 2.5 to about 250 mg/L, e.g., about 20 to about 200 mg/L or about 20 to about 150 mg/L. For example, the copper electroplating solution according to the present embodiment may include hydrogen chloride (HCl) at a concentration of about 2.5 to about 250 mg/L. In an implementation, the copper electroplating solution may include sodium chloride (NaCl) instead of hydrogen chloride.

The copper electroplating solution according to the present embodiment may include the first additive at a concentration of about 0.5 to about 200 mg/L, e.g., about 1.0 to about 50 mg/L. The first additive may include a compound represented by Formula 1, below.

[Formula 1]

In Formula 1, R may be hydrogen or an alkyl and m may be an average degree of polymerization, e.g., an integer of about 6 to about 14.

The compound represented by Formula 1 may be a polyether compound. For example, the first additive may include a polyether compound having benzene rings.

The copper electroplating solution according to the present embodiment may include the second additive at a concentration of about 10 to about 400 mg/L, e.g., about 15 to about 200 mg/L. The second additive may include a compound represented by Formula 2, below.

[Formula 2]

In Formula 2, D may include hydrogen, an alkyl, or a metal.

For example, D may be hydrogen (H) or counter ions such as lithium (Li), sodium (Na), potassium (K), etc. The compound represented by Formula 2 may be a di-sulfide compound.

The copper electroplating solution according to the present embodiment may include the third additive at a concentration of about 0.5 to about 200 mg/L, e.g., about 1 to about 50 mg/L. The third additive may include a compound including a moiety represented by Formula 3, below.

[Formula 3]

In Formula 3, n may represent an average degree of polymerization e.g., about 5 to about 100, or about 18.

The compound including the moiety represented by Formula 3 may be a benzyl-phenyl modified polyethyleneimine.

For example, the compound represented by Formula 3 may be a benzyl-phenyl modified polyethyleneimine compound having benzene rings. Cl⁻ ions may maintain the compound in an electrically neutral state.

A copper electroplating solution according to another embodiment may include, e.g., copper (II) MSA as a copper supply source, MSA as an electrolytic material, a chlorine ion source, the second additive, the third additive, a fourth additive, and water. The first additive of the copper electroplating solution according to the previous embodiment may be replaced with the fourth additive. The fourth additive may include a copolymer of polypropylene glycol ($(CH_2CH(OH)CHOH)_n$) (n being a positive integer) and polyethylene oxide ($C_2H_4O$). For example, the fourth additive may include a copolymer of about 90% by mass of polypropylene glycol and about 10% by mass of polyethylene oxide. Alternatively, the co-polymer may include a diol compound having an average molecular weight of about 3,800. A concentration of the fourth additive may be understood with reference to the copper electroplating solution according to the previous embodiment, e.g., a concentration of the fourth additive may correspond to the concentration of the first additive described above.

A copper electroplating solution according to yet another embodiment may include, e.g., copper (II) MSA as a copper supply source, MSA as an electrolytic material, a chlorine ion source, the second additive, the third additive, a fifth additive, and water. The first additive or the fourth additive of the copper electroplating solution according to the previous embodiments may be replaced with the fifth additive. For example, the fifth additive may include a copolymer of about 60% by mass of polypropylene glycol and about 40% by mass of polyethylene oxide. Alternatively, the copolymer may include a diol compound having an average molecular weight of about 4,200. A concentration of the fifth additive may be understood with reference to the copper electroplating solution according to the previous embodiment, e.g., a concentration of the fifth additive may correspond to the concentration of the first additive described above.

A copper electroplating solution according to still another embodiment may include, e.g., copper (II) MSA as a copper supply source, MSA as an electrolytic material, a chlorine ion source, the second additive, the third additive, a sixth additive, and water. The first additive, the fourth additive, or the fifth additive of the previous embodiments may be replaced with the sixth additive.

The sixth additive may include a compound represented by Formula 4, below.

[Formula 4]

$$R-O-(C_2H_4O)_p-H$$

In Formula 4, p may be an average degree of polymerization of, e.g., about 9, and R may include, e.g., a group represented by Formula 5 or Formula 6 or a combination of two of the groups.

[Formula 5]

The group represented by Formula 5 may include or may be derived from a secondary aliphatic alcohol having 11 carbon atoms.

[Formula 6]

The group represented by Formula 6 may include or may be derived from a primary aliphatic alcohol having 11 carbon atoms.

Accordingly, the sixth additive may include a compound obtained by adding ethylene oxide to a primary aliphatic alcohol having 11 carbon atoms and a diol compound obtained by adding ethylene oxide to a secondary aliphatic alcohol having 11 carbon atoms. For example, the sixth additive may include a diol compound obtained by adding about 10% by mass ethylene oxide to a mixture of a primary aliphatic alcohol having 11 carbon atoms and a secondary aliphatic alcohol having 11 carbon atoms at a ratio of about 1:1. The primary aliphatic alcohol having the 11 carbon atoms and the secondary aliphatic alcohol having the 11 carbon atoms may be mixed at a mass ratio. In addition, a concentration of the sixth additive in the solution may be understood with reference to the copper electroplating solution according to the previous embodiment, e.g., a concentration of the sixth additive may correspond to the concentration of the first additive described above.

A copper electroplating solution according to still another embodiment may include, e.g., copper (II) MSA as a copper supply source, MSA as an electrolytic material, a chlorine ion source, the first additive, the second additive, a seventh additive, and water. The third additive of the copper electroplating solution according to the previous embodiment may be replaced with the seventh additive.

The seventh additive may include a compound including a moiety represented by Formula 7, below.

[Formula 7]

In Formula 7, "a" may be a number such that the seventh additive has a number-average molecular weight of about 30,000, and M may be an alkali metal (e.g., potassium (K)).

In contrast to the third additive, the seventh additive may include a benzyl-phenyl modified polyethyleneimine obtained by replacing benzene rings with polyethylene having sulfonic acid salts. In addition, a concentration of the seventh additive in the solution may be understood with reference to the copper electroplating solution according to the previous embodiment, e.g., a concentration of the seventh additive may correspond to the concentration of the third additive described above.

A copper electroplating solution according to still another embodiment may include copper (II) MSA as a copper supply source, MSA as an electrolytic material, a chlorine ion source, the first additive, the second additive, an eighth additive, and water. For example, the third additive or the seventh additive according to the previous embodiments may be replaced with the eighth additive.

The eighth additive may include a compound including a moiety represented by Formula 8, below.

[Formula 8]

In Formula 8, "b" may be a number such that the eighth additive has a number-average molecular weight of about 70,000, and X' may be a cancellation molecule or counter ion (e.g., Cl⁻).

The eighth additive may include a quaternized poly(2-vinylpyridian) compound. In addition, a concentration of the eighth additive in the solution may be understood with reference to the copper electroplating solution according to the previous embodiment, e.g., a concentration of the eighth additive may correspond to the concentration of the third additive described above. The counter ion may maintain the monomer in an electrically neutral state.

A copper electroplating solution according to still another embodiment may include, e.g., copper (II) MSA as a copper supply source, MSA as an electrolytic material, a chlorine ion source, the first additive, the second additive, a ninth additive, and water. For example, the third additive, the seventh additive, or the eighth additive according to the previous embodiments may be replaced with the ninth additive.

The ninth additive may include a compound including a moiety represented by Formula 9, below.

[Formula 9]

In Formula 9, "c" may be a number such that the ninth additive has a number-average molecular weight of about 60,000.

The ninth additive may include a poly(2-vinylpyridian) compound. A concentration of the ninth additive in the solution may be understood with reference to the copper electroplating solution according to the previous embodiment, e.g., a concentration of the ninth additive may correspond to the concentration of the third additive described above.

A copper electroplating solution according to still another embodiment may include, e.g., copper (II) MSA, MSA, a chlorine ion source, the first additive, the second additive, a tenth additive, and water. For example, the third additive, the seventh additive, the eighth additive, or the ninth additive according to the previous embodiments may be replaced with the tenth additive.

The tenth additive may include a compound including the two moieties represented by Formula 10, below.

[Formula 10]

In Formula 10, x and y may be numbers such that the tenth additive has a number-average molecular weight of about 40,000 and may be in a ratio of about 5:9.5.

For example, the tenth additive may include a co-polymer of vinylpyrrolidone and methylvinyl imidazolium chloride. In an implementation, the co-polymer may include the vinylpyrrolidone and the methylvinyl imidazolium chloride in a ratio of about 5:9.5. A concentration of the tenth additive in the solution may be understood with reference to the copper electroplating solution according to the previous embodiment, e.g., a concentration of the tenth additive may correspond to the concentration of the third additive described above.

In an implementation, the copper electroplating solutions according the embodiments may further include, e.g., a surfactant, an anti-foamer, and/or a ductilizer. The copper electroplating solutions according to the embodiments may include the surfactant in a concentration of about 0.05 to about 10 mg/L. The surfactant may include, e.g., a polyoxyethylene alkylether (R—O(CH$_2$CH$_2$O)$_m$H) (R may be an alkyl and m may be a positive integer), a sorbitan fatty acid ester, a fatty acid diethanolamine (R—CON(CH$_2$CH$_2$OH)$_2$) (R may be an alkyl), an alkyl glycol such as alkylmonoglycerylether (R—OCH$_2$CH(OH)CH$_2$OH) (R may be an alkyl), a PEG polymer, and/or a polyvinyl alcohol polymer. In addition, the copper electroplating solution according to the embodiments may include various suitable anti-foamers and/or ductilizers.

The copper electroplating solution may be provided in the form of an aqueous solution or a dispersing solution.

The copper electroplating solution may be prepared by adding desired ones of the first through tenth additives to a base solution. In this case, aqueous solutions may include the respective first through tenth additives or a single aqueous solution obtained by blending some or all of the first through tenth additives may be added to the base solution.

The base solution may include, e.g., water, copper (II) MSA, MSA, and the chlorine ion source.

The copper (II) MSA may be provided in an anhydrous state and may be blended with the base solution. When copper (II) MSA is replaced with copper sulfate, copper sulfate may be provided in a hydrous state, e.g., as a pentahydrate (CuSO$_4$:5H$_2$O), and may be blended with the base solution.

MSA, sulfuric acid, and/or the chlorine ion source may be separately provided and may be blended with the base solution.

Hereinafter, a copper electroplating process using the copper electroplating solutions according to the embodiments and a copper electroplating apparatus according to an embodiment will be described. Here, a process of forming through-silicon via (TSV) plugs in a semiconductor fabrication process will be described as an example of the copper electroplating process.

Figure 1:
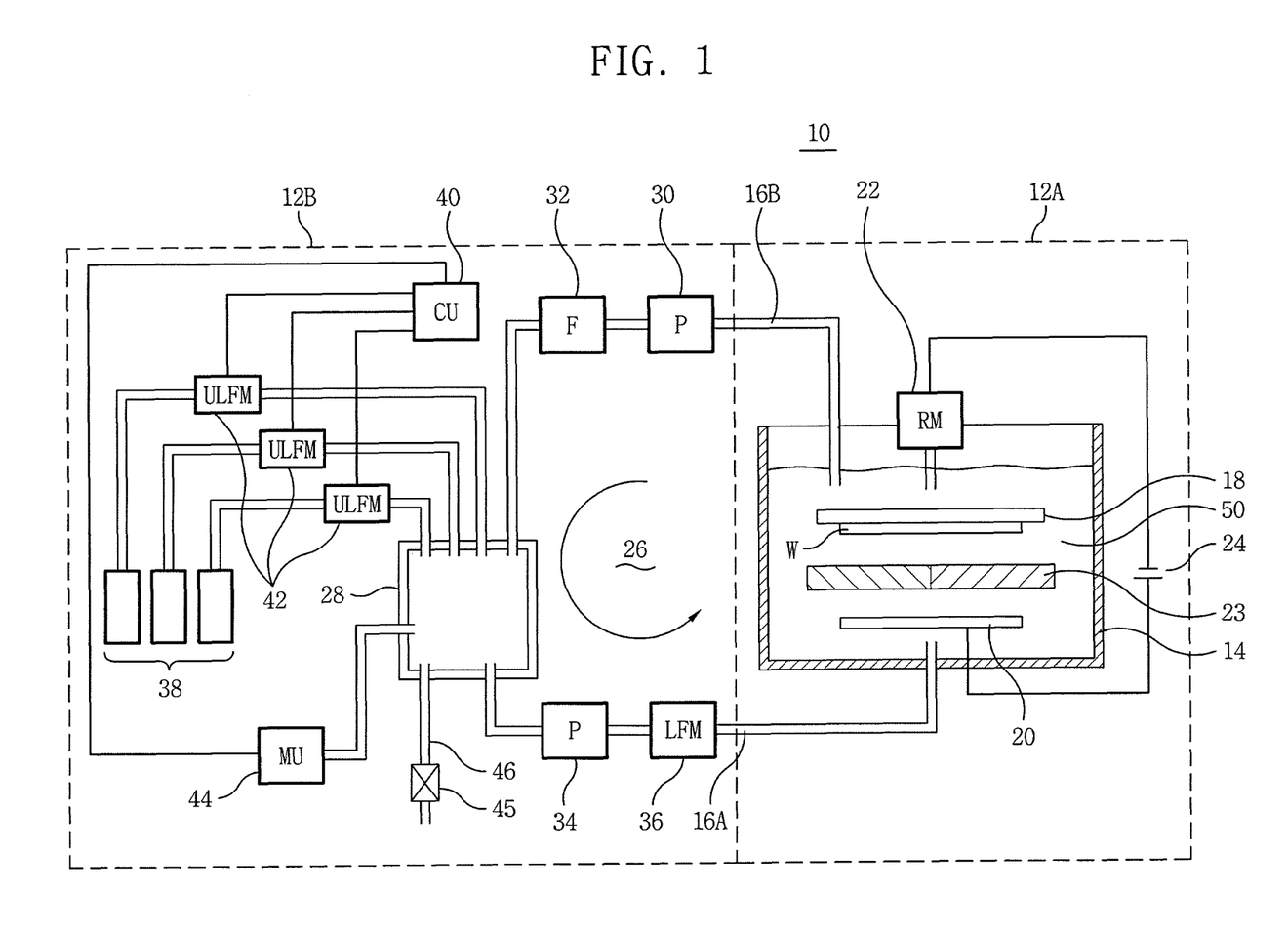
FIG. 1 illustrates a schematic diagram of a copper electroplating apparatus according to an embodiment.

FIG. 1 illustrates a schematic diagram of a copper electroplating apparatus according to an embodiment.

Referring to FIG. 1, the copper electroplating apparatus 10 may include an electroplating part 12A and a supply part 12B. The electroplating part 12A may include an electroplating container 14, a supply port 16A, a circulation port 16B, a cathode 18, an anode 20, a rotary motor 22, and a bias power source 24. A copper electroplating solution 50 may be supplied through the supply port 16A. The circulation port 16B may transfer the copper electroplating solution 50 from the electroplating container 14 to the supply part 12B and may circulate the copper electroplating solution 50. A wafer W may be held on the cathode 18. The cathode 18 may be driven and rotated by the rotary motor 22. A membrane 23 may be installed between the cathode 18 and the anode 20. The membrane 23 may disperse the copper electroplating solution 50 (supplied from the supply port 16A) and may supply the copper electroplating solution 50 onto the wafer W. For example, concentrations of components in the copper electroplating solution 50 may be uniformized or homogenized.

The supply part 12B may include a subsidiary storage container 28, a solution circulator 26, and a plurality of unit supply containers 38.

The solution circulator 26 may receive the copper electroplating solution 50 from the circulation port 16B and transfer the copper electroplating solution 50 to the subsidiary storage container 28. The solution circulator 26 may include a circulation pump 30 for circulating the copper electroplating solution 50 and a filter 32 for filtering the copper electroplating solution 50.

The solution circulator 26 may include a supply pump 34 (for transferring a re-blended copper electroplating solution 50a from the subsidiary storage container 28 to the electroplating container 14) and a liquid flow meter 36.

The unit supply containers 38 may separately supply individual components of the re-blended copper electroplating solution 50a to the subsidiary storage container 28 and/or may supply a blend of at least two components of the re-blended copper electroplating solution 50a to the subsidiary storage container 28. For example, an aqueous solution including one component of the re-blended copper electroplating solution 50a or a blend of at least two components thereof may be provided to the subsidiary storage container 28. Flow rates of the components provided from the unit supply containers 38 to the subsidiary storage container 28 may be controlled by unit liquid flow meters 42, and each of the unit liquid flow meters 42 may be controlled by a control unit 40.

A monitoring unit 44 may be installed in the subsidiary storage container 28. The monitoring unit 44 may sample a portion of the re-blended copper electroplating solution 50a in the subsidiary storage container 28 and may monitor whether the re-blended copper electroplating solution 50a is in an appropriate state to perform a copper electroplating process. The control unit 40 may receive monitoring information obtained based on a monitoring result and may control each of the unit liquid flow meters 42 based on the monitoring information.

An exhaust port 46 (having an exhaust valve 45) may be further installed in the subsidiary storage container 28.

During the copper electroplating process, the supply part 12B may circulate the copper electroplating solution 50 in the storage container 14 to exchange the copper electroplating solution 50 for a new solution, to purify, supplement, and recycle the copper electroplating solution 50, and/or to achieve various other purposes.

Hereinafter, a copper electroplating process using copper electroplating solutions and the copper electroplating apparatus 10 according to the embodiments will be described.

Figure 2A:
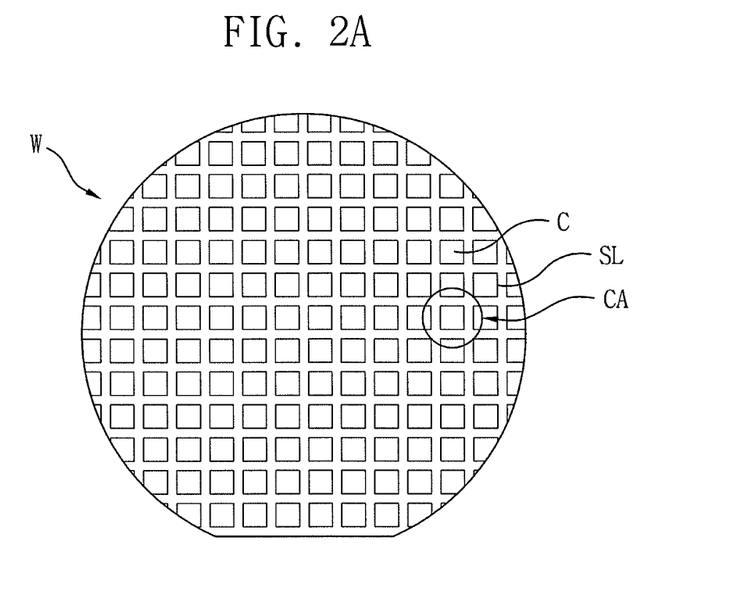
FIG. 2A illustrates a schematic plan view of a wafer before a through-silicon via (TSV) plug is formed according to an embodiment.
Figure 2B:
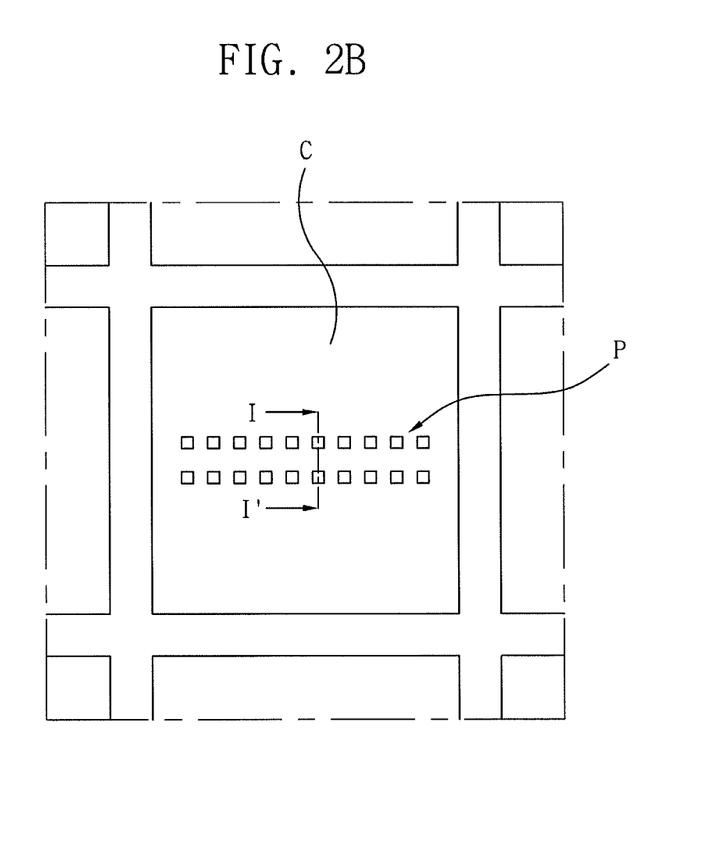
FIG. 2B illustrates a schematic enlarged view of a region CA of FIG. 2A.

FIG. 2A illustrates a schematic plan view of a wafer before TSV plugs are formed, according to an embodiment. FIG. 2B illustrates a schematic enlarged view of a region CA of FIG. 2A.

Referring to FIG. 2A, several tens to several hundreds of semiconductor chips C may be arranged in island forms on a wafer W. Scribe lanes SL may be arranged between respective semiconductor chips C. The wafer W may be a flat zone type or a notch type. In FIGS. 2A and 2B, a flat-zone-type wafer W is shown as an example. Although the semiconductor chips C may be formed in various other shapes, square-shaped semiconductor chips C are provided as an example.

Referring to FIG. 2B, the semiconductor chip C may include a plurality of input/output (I/O) pads P. In an implementation, the I/O pads P may be arranged in two rows in the center of the semiconductor chip C. In order to facilitate understanding of the embodiment, the TSV plugs are illustrated as being vertically aligned with the I/O pads P. Otherwise, the I/O pads P may be arranged along an outer portion of the semiconductor chip C or arranged in various other combinations.

FIGS. 3A through 3H illustrate longitudinal sectional views taken along line I-I' of FIG. 2B, showing stages in a copper electroplating process. As compared with FIG. 1, the wafer W may be understood as being turned upside down.

Figure 3A:
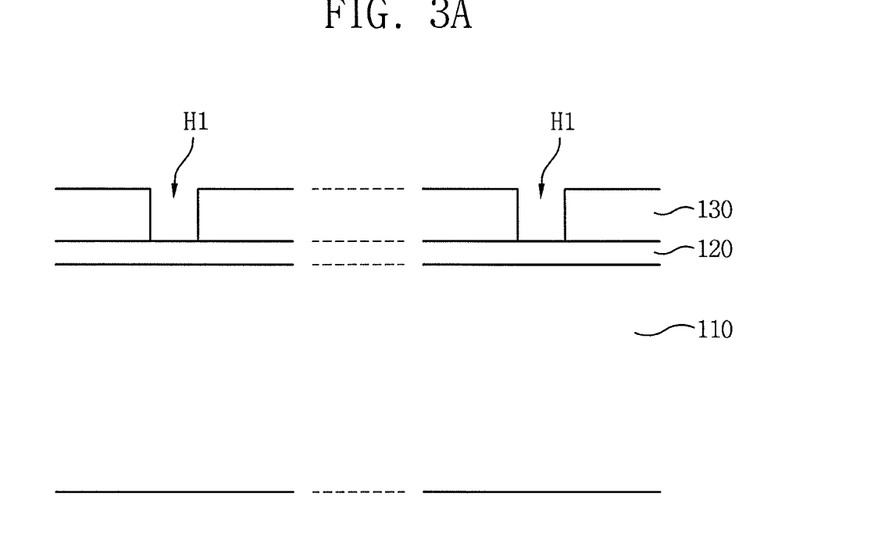
FIGS. 3A through 3H illustrate longitudinal sectional views taken along line I-I' of FIG. 2B, showing stages in a copper electroplating method according to an embodiment.

Referring to FIG. 3A, a protection layer 120 may be formed on a top surface of a wafer-level substrate 110, and a mask pattern 130 having first openings H1 for forming via holes, e.g., TSV holes, may be formed thereon. The protection layer 120 may include, e.g., a silicon oxide layer or a silicon nitride layer. The mask pattern 130 may include, e.g., an organic polymer resin, such as polyimide or photoresist, or an inorganic resin.

Figure 3B:
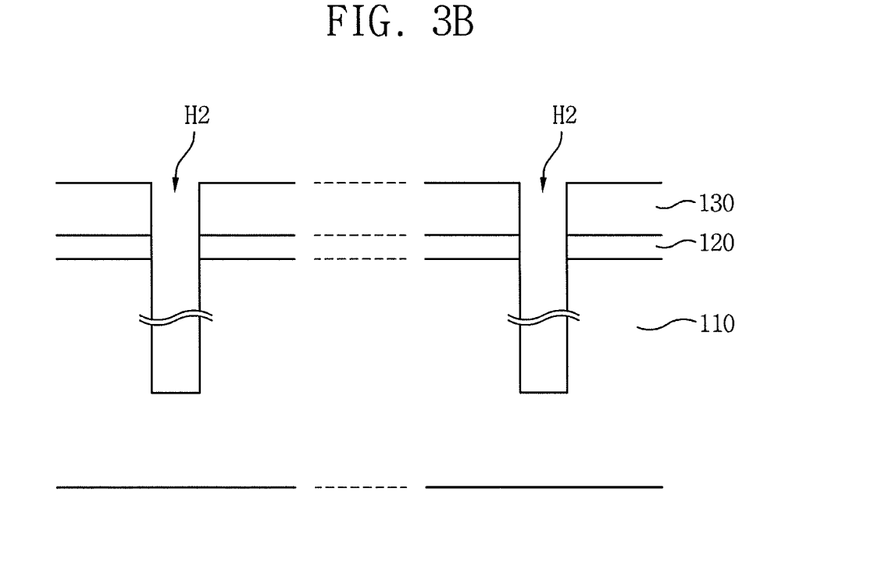

Referring to FIG. 3B, an etching process may be performed using the mask pattern 130 as an etch mask so that TSV holes H2 may be formed to a predetermined depth of the substrate 110. The TSV holes H2 may be formed only to a predetermined depth such that the substrate 110 is not penetrated.

Figure 3C:
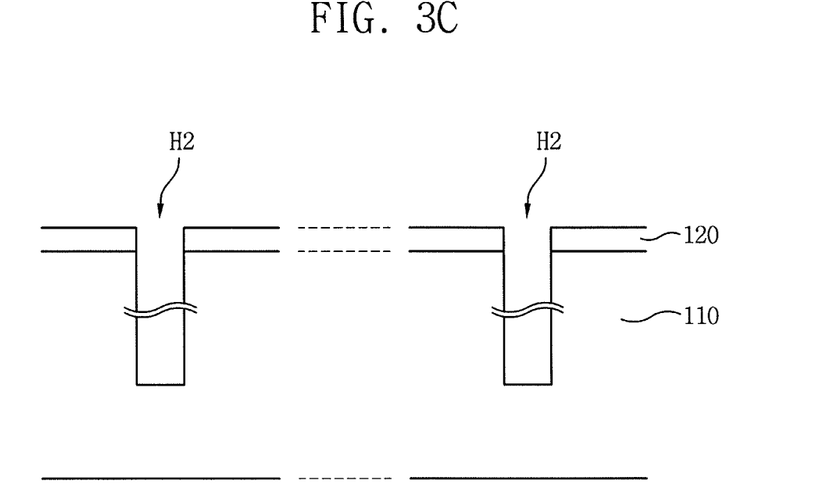

Referring to FIG. 3C, the mask pattern 130 may be removed. During the removal process, a surface of the protection layer 120 may be exposed.

Figure 3D:
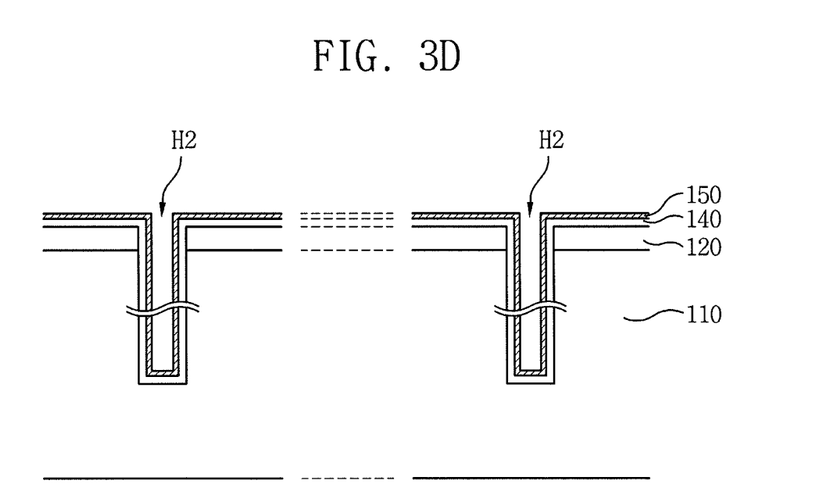

Referring to FIG. 3D, a barrier layer 140 and a seed layer 150 may be formed on surfaces of the protection layer 120 and the TSV holes H2. The barrier layer 140 may include, e.g., tantalum (Ta) or a titanium/titanium nitride (Ti/TiN) layer. In an implementation, the barrier layer 140 may include, e.g., tantalum. The seed layer 150 may include, e.g., copper. The barrier layer 140 and the seed layer 150 may be formed using, e.g., a physical vapor deposition (PVD) process.

Figure 3E:
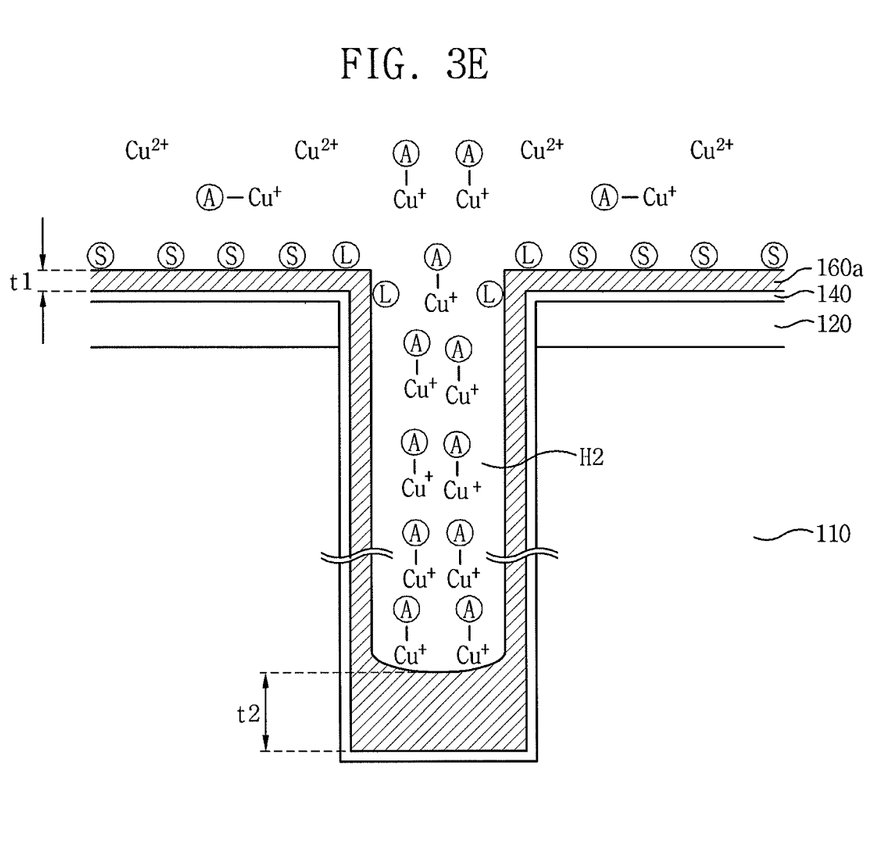

Referring to FIGS. 1 and 3E, a copper electroplating process may be performed using the copper electroplating solution 50 according to an embodiment so that a first copper electroplating layer 160a may be formed to cover a surface of the substrate 110 and fill the TSV holes H2. The copper electroplating process may be understood with reference back to FIG. 1. A case where the copper electroplating process is performed using the copper electroplating solution 50 according to the first-described embodiment will be described. For example, the copper electroplating solution 50 may include copper (II) MSA ($Cu(CH_3SO_2OH)_2$) as a copper supply source, MSA ($CH_3SO_2OH$) as an electrolytic material, the chlorine ion source, the first additive, the second additive, the third additive, and water. The wafer W of FIG. 1 may be interpreted as a substrate 110 of FIG. 3E.

The copper electroplating process according to the present embodiment may be performed, e.g., under the following process conditions.

The substrate 110 may be mounted on the cathode 18 and dipped in the copper electroplating solution 50. In this case, before being dipped in the copper electroplating solution 50, the substrate 110 may be rotated by the rotary motor 22 at a high rate of, e.g., about 400 to about 3,000 rotations per minute (RPM) to remove extraneous material from a surface of the substrate 110.

After being dipped in the copper electroplating solution 50, the substrate 110 and/or the copper electroplating solution 50 may be maintained at a temperature of about 15 to about 60° C., e.g., about 20 to about 40° C.

Current supplied between the cathode 18 and the anode 20 may be maintained at a density of about 0.1 to about 200 $mA/cm^2$. For example, a copper electroplating process for filling the TSV holes H2 may be performed at a relatively low current density of about 0.1 to about 100 $mA/cm^2$, while a copper electroplating process for forming the first copper electroplating layer 160a on the surface of the substrate 110 may be performed at a relatively high current density of about 1 to about 300 $mA/cm^2$. For example, the current density may be comparatively reduced or lower during the copper electroplating process for filling the TSV holes H2.

The substrate 110 may be rotated at a rate of about 6 to about 60 RPM in the copper electroplating solution 50 during the copper electroplating process.

The copper electroplating solution 50 may be circulated at a flow rate of about 0.1 to about 300 liters per minute (LPM), e.g., a flow rate of about 5 to about 30 LPM, through the supply port 16A and the circulation part 16B.

The copper electroplating process according to the present embodiment was experimentally conducted under the following process conditions. First, after the TSV holes H2 were filled with water, the substrate 110 was dipped in the copper electroplating solution 50 for approximately 2 minutes. Then, the copper electroplating solution 50 was maintained at a temperature of about 25° C., and the copper electroplating process was performed for a total of 38 minutes at current densities and for process times as shown in Table 1.

TABLE 1

| Current density ($mA/cm^2$) | Process time (min.) |
| --- | --- |
| 1.0 | 20 |
| 1.7 | 4 |
| 2.4 | 5 |
| 3.0 | 3 |
| 4.4 | 3 |
| 18 | 3 |

The current electroplating process was a process for electroplating the TSV holes H2 with copper. Thus, experiments were conducted while gradually increasing the current density. For example, a relatively low current density was maintained during formation of a copper electroplating layer in deep portions of the TSV holes H2, and the current density was gradually increased as portions of the TSV holes H2 to be electroplated with copper became shallower.

The copper electroplating solution 50 may include copper ions ($Cu^{2+}$), hydrogen ions ($H^+$), chlorine ions ($Cl^-$), a suppressor S, an accelerator A, and a leveler L. In the drawings, MSA is not shown. The suppressor S may be the first additive or one of the fourth through sixth additives. The accelerator A may be the second additive. The leveler L may be the third additive or one of the seventh through tenth additives. Here, a case where the suppressor S is the first additive, the accelerator A is the second additive, and the leveler L is the third additive will be described. The functions of the suppressor S, the accelerator A, and the leveler L will be described using an exemplary copper electroplating process that improves the performance of the copper electroplating solutions according to the embodiments.

The suppressor S may help improve wetting characteristics of the seed layer 150 and/or the first copper electroplating layer 160a. When a sufficiently high amount of the suppressor S is included in the copper electroplating solution 50, an electroplating speed may be controlled, thereby suppressing the formation of seams or voids. When a sufficiently small amount of the suppressor S is included in the copper electroplating solution 50, a reduction in the electroplating speed may be avoided, thereby maintaining throughput. For example, the suppressor S may serve as both a wetting agent and a suppressor. On an experimental basis, when the copper electroplating solution 50 contained the suppressor S at a content of about 0.5 to about 200 mg/L, desired wetting agent and suppressor properties were obtained. For example, when the copper electroplating solution 50 included the suppressor S at a concentration of about 1 to about 50 mg/L, even more desirable wetting agent and suppressor properties were obtained. The copper electroplating solution 50 used in the present experiment contained the suppressor S at a concentration of 2.86 mg/L. Also, when the molecular weight of the suppressor S is sufficiently low, excessive suppression of electroplating speed may be avoided, thereby maintaining a desired leveling effect. When the molecular weight of the suppressor S is sufficiently high, a reduction of an electroplating suppression effect may be avoided. Accordingly, to appropriately control the molecular weight of the suppressor S, the suppressor S may be polymerized at an average degree of polymerization of about 6 to about 14. In the present experiment, a compound was polymerized at an average degree of polymerization of 10, e.g., between 6 and 14, and used as the suppressor S.

The accelerator A may separate into mono sulfide compounds, and functional groups D of the mono sulfide compounds may combine with copper ions ($Cu^{2+}$) to change divalent ions into monovalent ions so that a copper electroplating reaction may be accelerated to thereby facilitate the copper electroplating process even at a low energy. For example, the accelerator A of the copper electroplating solution 50 may function as an electroplating accelerator. Accordingly, when the concentration of the accelerator A in the copper electroplating solution 50 is sufficiently high, a reduction in electroplating speed may be avoided, thereby maintaining sufficient throughput. When the concentration of the accelerator A in the copper electroplating solution 50 is sufficiently low, control of the electroplating speed may be facilitated. As shown in FIG. 3E, a smaller amount of the accelerator A (relative to the suppressor S) may be concentrated over the protection layer 120. In contrast, a greater amount of the accelerator A (relative to the suppressor S) may be concentrated within the TSV holes H2. Accordingly, the copper electroplating process may be performed at a higher speed within the TSV holes H2 compared to over the protection layer 120. Thus, a copper electroplating layer formed on bottom surfaces of the TSV holes H2 may be formed more rapidly than a copper electroplating layer formed over the protection layer 120. For example, the copper electroplating layer formed on bottom surfaces of the TSV holes H2 may have a thickness t2, which may be greater than a thickness t1 of the copper electroplating layer formed over the protection layer 12. When the copper electroplating solution 50 included the accelerator A at a concentration of about 10 to about 400 mg/L, desirable accelerator effects were obtained. For example, when the copper electroplating solution 50 included the accelerator A at a concentration of about 15 to about 200 mg/L, even more desirable accelerator effects were obtained. By experimenting with a copper electroplating process using the copper electroplating solution 50, it may be seen that maintaining the accelerator A concentration of about 10 mg/L or greater, a marked reduction in electroplating speed may be avoided. Also, maintaining the accelerator A at a concentration of about 400 mg/L or less, saturation of an electroplating-speed rising effect may be avoided and a reduction in the lifespan of the copper electroplating solution 50 may be avoided. The copper electroplating solution 50 used in the present experiments included the accelerator A at a concentration of about 40.8 mg/L.

The leveler L may be dissolved in water and may emit or provide cationic nitrogen, indicated by $N^+$ in FIG. 3E. In FIG. 3E, the leveler L may be indicated by $N^+$. The leveler L may move in a direction of a negative (−) electric field (i.e., toward the wafer W of FIG. 1) and may concentrate on a surface portion, a protrusion portion, and a low pattern-density portion of the substrate 110 and/or an entrance portion of the TSV hole H2, where an electric field concentrates during formation of a copper electroplating layer. A copper electroplating speed may be reduced in a portion where the leveler L is concentrated relative to other portions. Accordingly, due to the leveler L, the copper electroplating layer may be grown to a generally similar or even height. When the leveler L is included in the copper electroplating solution 50 at sufficiently high concentration or has a sufficient degree of polymerization, a degradation of the flatness of the copper electroplating layer may be avoided. When the leveler L is included at a sufficiently low concentration or has a sufficiently low degree of polymerization, a reduction in the copper electroplating speed may be avoided. Maintaining the concentration of the leveler L in the copper electroplating solution 50 at about 0.5 to about 200 mg/L may help ensure that desired leveling effects are obtained. For example, maintaining the concentration of the leveler L in the copper electroplating solution 50 at about 1 to about 50 mg/L may help ensure that even more desirable leveling effects are obtained. When the leveler L is included in the copper electroplating solution 50 at a concentration of about 0.5 mg/L or greater, a sufficient leveling effect may be produced, and poor surface flatness of the resultant copper electroplating layer may be avoided. In contrast, when the leveler L is included at a concentration of less than about 200 mg/L, a desired leveling improvement effect may be obtained. The copper electroplating solution 50 according to the present experiment included the leveler L at a concentration of about 2.45 mg/L. Also, the copper electroplating solution 50 may achieve a good leveling effect when the average degree n of polymerization of the compound represented Formula 3 is about 5 to about 100. In the present experiment, the third additive having an average degree n of polymerization of 18 was used. Maintaining the average degree n of polymerization of the leveler L at about 5 or greater may help ensure that the copper electroplating solution 50 exhibits sufficient leveling capability. Maintaining the average degree n of polymerization of the leveler L at about 100 or less may help ensure that an entire molar number of the leveler L is not reduced, thereby ensuring desired leveling effects are achieved.

In the present embodiment, various experiments were conducted using TSV holes H2 with a depth of about 50 μm or more, a diameter of about 5 μm or more, and an aspect ratio of 10 or more. In the experiments, a composition ratio of the copper electroplating solution 50 according to an embodiment was variously controlled, and experimental results and an analysis thereof will now be described.

When the copper electroplating solution 50 includes MSA, conductivity of the copper electroplating solution 50 may be increased to thereby elevate a copper electroplating speed. Accordingly, maintaining a sufficiently large amount of the MSA in the copper electroplating solution 50 at may help avoid a reduction in the copper electroplating speed, thereby maintaining desired productivity and/or throughput. Maintaining a sufficiently small amount of MSA in the copper electroplating solution 50 at may help facilitate controlling of the copper electroplating speed. Maintaining the concentration of the MSA in the copper electroplating solution 50 at about 5 to about 20 g/L may help ensure that a desired copper electroplating speed is obtained. For example, when the copper electroplating solution 50 included the MSA at a concentration of about 10 to 20 g/L, even more desirable copper electroplating speeds may be obtained. Maintaining the concentration of the MSA at about 5 g/L or greater may help reduce or prevent a marked reduction in the electroplating speed. Maintaining the concentration of the MSA at about 20 g/L or less may help facilitate controlling of the copper electroplating speed. The copper electroplating solution 50 used in the present experiment included MSA at a concentration of about 20 g/L.

MSA (functioning as the electrolytic material) may tend to wholly increase the copper electroplating speed, while the accelerator A may tend to partially increase the copper electroplating speed.

When the copper electroplating solution 50 includes chlorine ions, the copper electroplating speed may be suppressed. For example, the chlorine ions may assist the suppressor S in suppressing the copper electroplating speed. The copper electroplating solution 50 may include sodium chloride (NaCl) and/or hydrogen chloride (HCl) as a chlorine ion source for emitting or providing the chlorine ions. For example, the copper electroplating solution 50 may include hydrogen chloride (HCl) at a concentration of about 20 to about 150 mg/L. The copper electroplating solution 50 used in the present experiment included the chlorine ion source at a concentration of about 50 mg/L. The chlorine ion source may tend to wholly suppress the copper electroplating speed, while the suppressor S may tend to partially suppress the copper electroplating speed.

The copper electroplating solution 50 used in the present experiment included copper (II) MSA at a concentration of about 319 g/L, and may serve as a copper supply source for supplying copper ions ($Cu^+$). Maintaining a sufficiently large concentration of the copper supply source may help ensure that a sufficient amount of copper is supplied, thereby ensuring good electroplating productivity and/or throughput. Maintaining a sufficiently small concentration of the copper supply source may help facilitate formation of a high-quality copper electroplating layer.

Figure 3F:
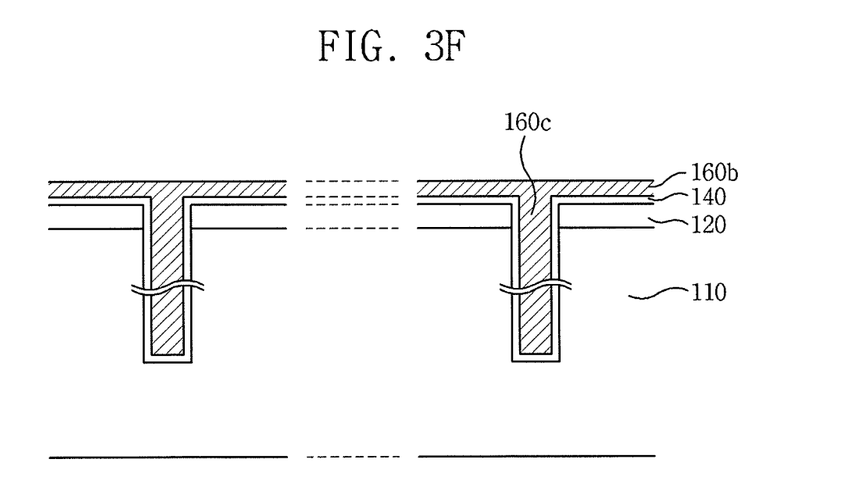

Referring to FIG. 3F, the copper electroplating process described with reference to FIG. 3E may be performed to form a surface copper electroplating layer 160b on the protection layer 120 and form TSV plugs 160c to fill the TSV holes H2. The TSV plugs 160c may be formed without seams or voids. The surface copper electroplating layer 160b and the TSV plugs 160c may be formed at similar surface levels as demonstrated by the image of FIG. 4.

Figure 3G:
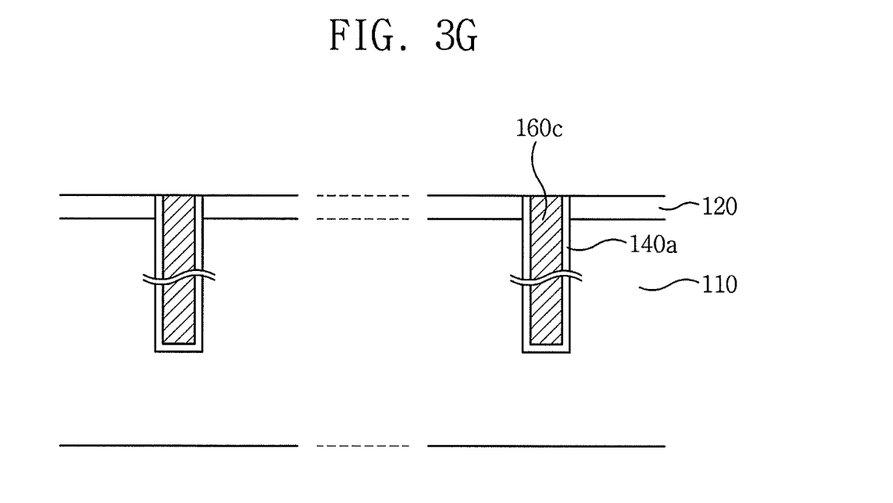

Referring to FIG. 3G, the surface copper electroplating layer 160b may be removed from the protection layer 120 using a planarization process, e.g., a chemical mechanical polishing (CMP) process, thereby leaving only the TSV plugs 160c. The protection layer 120 and the TSV plugs 160c may be at the same surface level.

Figure 3H:
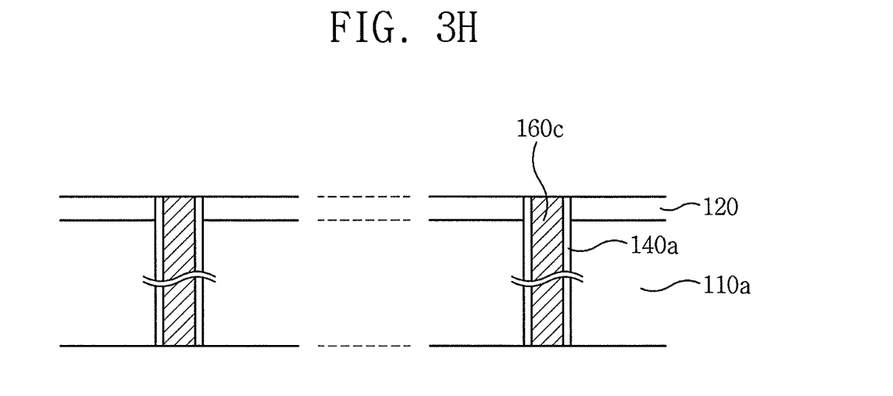

Referring to FIG. 3H, a rear surface of the wafer-level substrate 110 may be thinned out using, e.g., a CMP process or grinding process, thereby exposing rear surfaces of the TSV plugs 160c. The wafer-level substrate 110 may have a thickness of several hundred μm, e.g., 700 μm, and a thinned substrate 110a may have a thickness of several tens to one hundred several tens μm, e.g., 120 μm. Due to the current process, TSV plugs 160c penetrating the substrate 110a in a vertical direction may be completed.

Afterwards, I/O pads, under-bump metals (UBMs), redistribution structures, or solder bumps may be respectively formed on and under the TSV plugs 160c.

Figure 4:
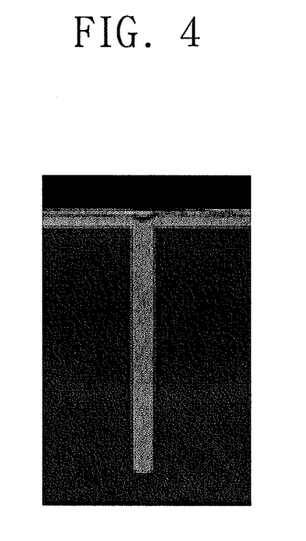
FIG. 4 illustrates a scanning electron microscope (SEM) image of a copper electroplating layer and a TSV plug shown in FIG. 3F.

FIG. 4 illustrates a scanning electron microscope (SEM) image of a copper electroplating layer and a TSV plug similar to the stage shown in FIG. 3F. Referring to FIG. 4, it may be seen that TSV plugs 160c were formed without seams or voids. For example, when a copper electroplating layer and/or a TSV plug is formed according to a copper electroplating method using a copper electroplating solution of an embodiment, even if a copper electroplating process is performed at high speed, the TSV plug or the copper electroplating process may be formed without generating seams or voids, thus facilitating manufacture of reliable electronic devices and increasing throughout.

Figure 5:
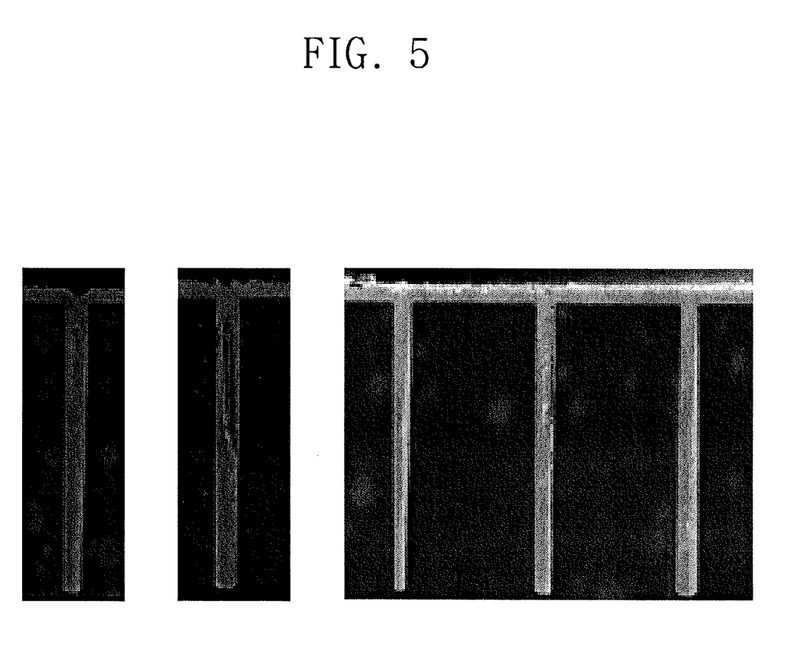
FIG. 5 illustrates SEM images of TSV plugs formed using a comparative copper electroplating solution.

FIG. 5 illustrates SEM images of TSV plugs formed using a comparative copper electroplating solution. Referring to the SEM images of FIG. 5, it may be seen that seams or voids were seriously generated in all the three SEM images. For example, excellent effects of a copper electroplating solution and a copper electroplating method according to the embodiments may be visually contrasted with conventional electroplating techniques and demonstrated.

A copper electroplating solution according to an embodiment may be advantageous in filling via holes having a high aspect ratio with a copper electroplating layer at high speed. Also, the copper electroplating method according to an embodiment may help ensure that reliable TSV plugs are formed without seams or voids. A method of preparing a copper electroplating solution according to the embodiments and a copper electroplating apparatus to which the method may be applied are described above in detail. Thus, the copper electroplating solution and apparatus can be applied to various industries by those skilled in the art.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A copper electroplating method, comprising:
dipping a substrate in a copper electroplating solution, the substrate including a seed layer; and
forming a copper electroplating layer on the seed layer, wherein:

the copper electroplating solution includes water, a copper supply source, an electrolytic material, and a first additive, the first additive includes a compound represented by Formula 1, below:

[Formula 1]

in Formula 1, R is hydrogen or alkyl, and m is an integer of about 6 to about 14.

2. The method as claimed in claim 1, wherein the copper electroplating solution includes the first additive at a concentration of about 0.5 to about 200 mg/L.

3. The method as claimed in claim 1, wherein:

the copper electroplating solution further includes a second additive, the second additive including a compound represented by Formula 2, below,

[Formula 2]

D is hydrogen, an alkyl, or a metal.

4. The method as claimed in claim 3, wherein the copper electroplating solution includes the second additive at a concentration of about 10 to about 400 mg/L.

5. The method as claimed in claim 1, wherein:

the copper electroplating solution further includes a third additive, the third additive including a compound including a moiety represented by Formula 3, below

[Formula 3]

n is a natural number of about 5 to about 100.

6. The method as claimed in claim 5, wherein the copper electroplating solution includes the third additive at a concentration of about 0.5 to about 200 mg/L.

7. The method as claimed in claim 1, wherein the copper supply source includes copper (II) methanesulfonic acid, the copper (II) methanesulfonic acid being included in the copper electroplating solution at a concentration of about 200 to about 500 g/L.

8. The method as claimed in claim 1, wherein the electrolytic material includes methanesulfonic acid, the methanesulfonic acid being included in the copper electroplating solution at a concentration of about 5 to about 20 g/L.

9. The method as claimed in claim 1, wherein the copper electroplating solution further includes a chlorine ion source.

10. The method as claimed in claim 9, wherein the chlorine ion source includes hydrogen chloride, the hydrogen chloride being included in the copper electroplating solution at a concentration of about 2.5 to about 250 ml/L.

11. The method as claimed in claim 1, wherein the copper electroplating solution further includes polyethylene glycol.

12. The method as claimed in claim 1, wherein:

the copper electroplating solution is provided in an electroplating container of a copper electroplating apparatus, the copper electroplating apparatus includes an anode and a cathode, and forming the copper electroplating layer includes applying current between the anode and the cathode at a density of about 1.0 to about 100 mA/cm$^2$.

13. The method as claimed in claim 12, wherein applying the current includes initially applying current at a relatively low density and subsequently applying current at a relatively high density.

14. The method as claimed in claim 1, wherein the method is performed with a copper electroplating apparatus, the copper electroplating apparatus including:

a rotary motor that rotates the substrate in the copper electroplating solution in a horizontal direction; and a solution circulator that circulates the copper electroplating solution through an electroplating container and a subsidiary storage container, wherein the rotary motor rotates the substrate in the copper electroplating solution at a rate of about 1 to about 60 RPM, and the copper electroplating solution is circulated through the solution circulator at a rate of about 1 to about 30 LPM.

* * * * *